(12) United States Patent
Yamamoto et al.

(10) Patent No.: US 10,124,562 B2
(45) Date of Patent: Nov. 13, 2018

(54) METAL-COATED NONWOVEN FABRIC WITH ADHESIVE LAYER, PROCESS FOR PRODUCING METAL-COATED NONWOVEN FABRIC WITH ADHESIVE LAYER, AND COVERED CORE WIRE

(71) Applicant: SEKISUI CHEMICAL CO., LTD., Osaka, Osaka (JP)

(72) Inventors: Hiroko Yamamoto, Shiga (JP); Kouhei Maruo, Shiga (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 15/749,086

(22) PCT Filed: Oct. 7, 2016

(86) PCT No.: PCT/JP2016/079938
§ 371 (c)(1),
(2) Date: Jan. 30, 2018

(87) PCT Pub. No.: WO2017/061597
PCT Pub. Date: Apr. 13, 2017

(65) Prior Publication Data
US 2018/0222154 A1      Aug. 9, 2018

(30) Foreign Application Priority Data

Oct. 7, 2015    (JP) .................................. 2015-199240

(51) Int. Cl.
*H05K 1/00*        (2006.01)
*H01B 7/00*        (2006.01)
(Continued)

(52) U.S. Cl.
CPC ............... *B32B 15/14* (2013.01); *B32B 5/022* (2013.01); *C09J 7/21* (2018.01); *C09J 11/04* (2013.01);
(Continued)

(58) Field of Classification Search
CPC . B32B 15/14; B32B 5/022; C09J 7/21; H01B 7/0225
(Continued)

(56) References Cited

U.S. PATENT DOCUMENTS

2003/0082363 A1* 5/2003 Nakagiri ................... B32B 5/26
                                                                428/313.3
2007/0202302 A1* 8/2007 Matsuura ................ B32B 3/085
                                                                428/174
(Continued)

FOREIGN PATENT DOCUMENTS

JP          3063233 U       10/1999
JP      2001-160699 A        6/2001
(Continued)

OTHER PUBLICATIONS

Written Opinion of the International Searching Authority (PCT/ISA/237) for Application No. PCT/JP2016/079938 dated Dec. 6, 2016 (English Translation dated Apr. 19, 2018).
(Continued)

*Primary Examiner* — Sherman Ng
(74) *Attorney, Agent, or Firm* — Cheng Law Group, PLLC

(57) ABSTRACT

A metal-coated nonwoven fabric with an adhesive layer capable of enhancing adhesion is provided. The metal-coated nonwoven fabric with an adhesive layer according to the present invention includes a metal-coated nonwoven fabric and an adhesive layer disposed on one surface side of the metal-coated nonwoven fabric, the metal-coated nonwo-
(Continued)

ven fabric including a nonwoven fabric and a metal portion coating the surface of a fiber in the nonwoven fabric, an average thickness of the metal portion being 2 μm or less, an average thickness of the metal-coated nonwoven fabric being 25 μm or less, an open area ratio of the metal-coated nonwoven fabric being 1% or more and 50% or less.

13 Claims, 2 Drawing Sheets

(51) Int. Cl.
*B32B 15/14* (2006.01)
*B32B 5/02* (2006.01)
*C23C 14/20* (2006.01)
*H01B 7/02* (2006.01)
*C09J 7/21* (2018.01)
*C09J 11/04* (2006.01)

(52) U.S. Cl.
CPC ........... *C23C 14/20* (2013.01); *H01B 7/0225* (2013.01); *B32B 2311/08* (2013.01); *B32B 2311/12* (2013.01); *B32B 2311/22* (2013.01); *B32B 2405/00* (2013.01); *B32B 2457/04* (2013.01)

(58) Field of Classification Search
USPC ............................................. 174/72 A, 258
See application file for complete search history.

(56) References Cited

U.S. PATENT DOCUMENTS

| | | | |
|---|---|---|---|
| 2008/0064279 A1 | 3/2008 | Browning et al. | |
| 2008/0230173 A1* | 9/2008 | Cho | H01J 9/205 156/182 |
| 2009/0291303 A1 | 11/2009 | Kopf et al. | |
| 2012/0111627 A1 | 5/2012 | Kato et al. | |
| 2016/0044839 A1* | 2/2016 | Akahane | H05K 9/0086 442/1 |
| 2016/0122482 A1* | 5/2016 | Higuchi | B32B 27/304 428/221 |
| 2016/0133579 A1* | 5/2016 | Akiba | H01L 23/552 257/659 |

FOREIGN PATENT DOCUMENTS

| | | |
|---|---|---|
| JP | 2002-327154 A | 11/2002 |
| JP | 2003-236996 A | 8/2003 |
| JP | 2009-280818 A | 12/2009 |
| JP | 2013-34009 A | 2/2013 |
| JP | 2014-67521 A | 4/2014 |
| JP | 5660418 B1 | 1/2015 |
| WO | WO-2011/010697 A1 | 1/2011 |

OTHER PUBLICATIONS

International Search Report for the Application No. PCT/JP2016/079938 dated Dec. 6, 2016.
Written Opinion of the International Searching Authority (PCT/ISA/237) for Application No. PCT/JP2016/079938 dated Dec. 6, 2016.

* cited by examiner

[FIG. 1]
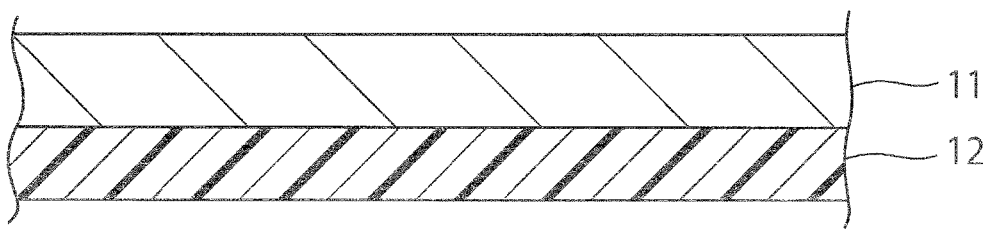
[FIG. 2]
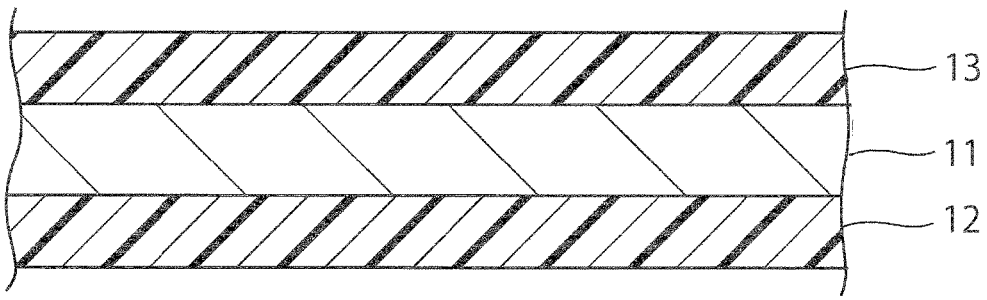

[FIG. 3]
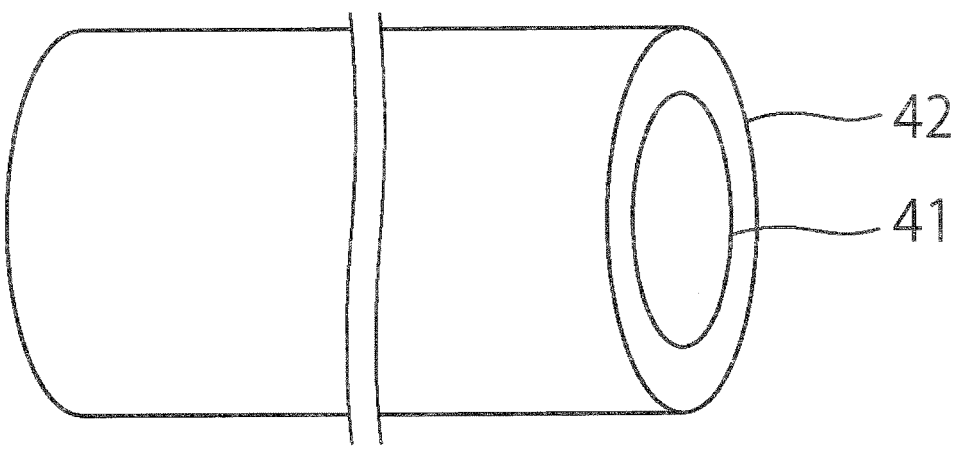

METAL-COATED NONWOVEN FABRIC WITH ADHESIVE LAYER, PROCESS FOR PRODUCING METAL-COATED NONWOVEN FABRIC WITH ADHESIVE LAYER, AND COVERED CORE WIRE

TECHNICAL FIELD

The present invention relates to a metal-coated nonwoven fabric with an adhesive layer provided with a metal-coated nonwoven fabric whose fibers are coated with metal and a process for producing a metal-coated nonwoven fabric with an adhesive layer. The present invention also relates to a covered core wire using the metal-coated nonwoven fabric with an adhesive layer.

BACKGROUND ART

In core wires such as wire harnesses used for communication wiring of vehicles, the surface may be covered for the purpose of electromagnetic wave shielding or the like. Conventionally, a thin metal film is used for such covering.

However, there is a problem that cracks tend to occur when the metal film is folded or bent to be wound around the core wire. Furthermore, there is a problem that the metal film tends to peel off from the core wire due to the shape restoring force of the metal film.

Meanwhile, in Patent Documents 1 and 2 shown below, a plated nonwoven fabric obtained by performing metal plating treatment on a nonwoven fabric is disclosed. Patent Document 1 discloses that a plated nonwoven fabric can be used by being wound around a wire bundle. Patent Document 2 discloses that an adhesive may be laminated on the surface of the plated nonwoven fabric.

RELATED ART DOCUMENT

Patent Document

Patent Document 1: JP 2014-67521 A
Patent Document 2: JP 2013-34009 A

SUMMARY OF THE INVENTION

Problems to be Solved by the Invention

When a plated nonwoven fabric as described in Patent Documents 1 and 2 is wound around a core wire, the plated nonwoven fabric may be peeled off.

An object of the present invention is to provide a metal-coated nonwoven fabric with an adhesive layer capable of enhancing adhesion and a process for producing a metal-coated nonwoven fabric with an adhesive layer. The present invention also provides a covered core wire using the metal-coated nonwoven fabric with an adhesive layer.

Means for Solving the Problems

According to a broad aspect of the present invention, there is provided a metal-coated nonwoven fabric with an adhesive layer including a metal-coated nonwoven fabric and an adhesive layer disposed on one surface side of the metal-coated nonwoven fabric, the metal-coated nonwoven fabric including a nonwoven fabric and a metal portion coating the surface of a fiber in the nonwoven fabric, an average thickness of the metal portion being 2 µm or less, an average thickness of the metal-coated nonwoven fabric being 25 µm or less, an open area ratio of the metal-coated nonwoven fabric being 1% or more and 50% or less.

In a certain aspect of the metal-coated nonwoven fabric with an adhesive layer according to the present invention, the average thickness of the metal portion is 1 µm or less.

In a certain aspect of the metal-coated nonwoven fabric with an adhesive layer according to the present invention, a material of the metal portion includes nickel, copper or silver.

The average thickness of the metal-coated nonwoven fabric is preferably 20 µm or less. The open area ratio of the metal-coated nonwoven fabric is preferably 30% or less. The open area ratio of the metal-coated nonwoven fabric is preferably 3% or more.

In a certain aspect of the metal-coated nonwoven fabric with an adhesive layer according to the present invention, a glass transition temperature of a material of the nonwoven fabric is 150° C. or higher.

In a certain aspect of the metal-coated nonwoven fabric with an adhesive layer according to the present invention, the adhesive layer contains a conductive filler. The content of the conductive filler in the adhesive layer is preferably 0.1% by weight or more and 80% by weight or less.

According to a broad aspect of the present invention, there is provided a process for producing a metal-coated nonwoven fabric with an adhesive layer, the process including a step of compressing an uncompressed nonwoven fabric to obtain an nonwoven fabric having an average thickness of ⅘ or less of an average thickness of the uncompressed nonwoven fabric, a step of coating a surface of a fiber in the nonwoven fabric with a metal portion to obtain a metal-coated nonwoven fabric, and a step of disposing an adhesive layer on one surface side of the metal-coated nonwoven fabric to obtain a metal-coated nonwoven fabric with an adhesive layer.

In a certain aspect of the process for producing a metal-coated nonwoven fabric with an adhesive layer according to the present invention, the uncompressed nonwoven fabric is compressed by calendering treatment.

In a certain aspect of the process for producing the metal-coated nonwoven fabric with an adhesive layer according to the present invention, the surface of the fiber in the nonwoven fabric is coated with a metal portion by sputtering.

According to a broad aspect of the present invention, there is provided a covered core wire including a core wire and a covering portion covering the surface of the core wire, the covering portion being the metal-coated nonwoven fabric with an adhesive layer.

Effect of the Invention

The metal-coated nonwoven fabric with an adhesive layer according to the present invention includes a metal-coated nonwoven fabric and an adhesive layer disposed on one surface side of the metal-coated nonwoven fabric, the metal-coated nonwoven fabric including a nonwoven fabric and a metal portion coating the surface of a fiber in the nonwoven fabric, an average thickness of the metal portion being 2 µm or less, an average thickness of the metal-coated nonwoven fabric being 25 µm or less, an open area ratio of the metal-coated nonwoven fabric being 1% or more and 50% or less, and therefore can enhance the adhesion

BRIEF DESCRIPTION OF DRAWINGS

FIG. 1 is a cross-sectional view of a metal-coated nonwoven fabric with an adhesive layer according to a first embodiment of the present invention.

FIG. 2 is a cross-sectional view of a metal-coated nonwoven fabric with an adhesive layer according to a second embodiment of the present invention.

FIG. 3 is a perspective view of a covered core wire according to the first embodiment of the present invention.

MODES FOR CARRYING OUT THE INVENTION

Hereinafter, the details of the present invention will be described.

(Metal-Coated Nonwoven Fabric with Adhesive Layer)

FIG. 1 is a cross-sectional view of a metal-coated nonwoven fabric with an adhesive layer according to a first embodiment of the present invention.

A metal-coated nonwoven fabric 1 with an adhesive layer shown in FIG. 1 includes a metal-coated nonwoven fabric 11 and an adhesive layer 12 disposed on one surface side of the metal-coated nonwoven fabric 11.

Like the metal-coated nonwoven fabric 1 with an adhesive layer, the metal-coated nonwoven fabric with an adhesive layer according to the present invention includes a metal-coated nonwoven fabric and an adhesive layer (first adhesive layer) disposed on one surface (first surface) side of the metal-coated nonwoven fabric with an adhesive layer. In the metal-coated nonwoven fabric 11, fibers are coated with metal portions on both surfaces of a nonwoven fabric.

FIG. 2 is a cross-sectional view of a metal-coated nonwoven fabric with an adhesive layer according to a second embodiment of the present invention.

A metal-coated nonwoven fabric with an adhesive layer 1A shown in FIG. 2 includes a metal-coated nonwoven fabric 11, an adhesive layer 12 (first adhesive layer) disposed on one surface (first surface) side of the metal-coated nonwoven fabric 11, and an adhesive layer 13 (second adhesive layer) disposed on the other surface (second surface) side opposite to the one surface of the metal-coated nonwoven fabric 11.

In the metal-coated nonwoven fabric with an adhesive layer according to the present invention, the metal-coated nonwoven fabric includes a nonwoven fabric and metal portions coating the surface of fibers in the nonwoven fabric. In the metal-coated nonwoven fabric with an adhesive layer according to the present invention, the average thickness of the metal portions is 2 μm or less. In the metal-coated nonwoven fabric with an adhesive layer according to the present invention, the average thickness of the metal-coated nonwoven fabric is 25 μm or less. In the metal-coated nonwoven fabric with an adhesive layer according to the present invention, the open area ratio of the metal-coated nonwoven fabric is 1% or more and 50% or less.

In the present invention, the average thickness of the metal portions is small. Therefore, gaps between the metal portions are large, and an opening portion of the metal-coated nonwoven fabric is relatively large. Therefore, at the time of adhesion, the adhesive layer can be impregnated into the opening portion of the metal-coated nonwoven fabric. According to the present invention, an adhesive component can directly enter the space between the surfaces of adjacent metal portions in the metal-coated nonwoven fabric. As a result, after adhesion, the adhesive layer and the metal-coated nonwoven fabric can be strongly integrated, and peeling due to repulsion can be suppressed. Therefore, in the present invention, by providing the above-described configuration, adhesion can be enhanced. The gaps between the metal portions are spaces between the surfaces of adjacent metal portions. The opening portion of the metal nonwoven fabric is a region in which no fiber or metal is present in the metal-coated nonwoven fabric. The opening portion of the metal nonwoven fabric is an internal space in the metal-coated nonwoven fabric.

In addition, in the present invention, the resistance can be lowered, and the electromagnetic wave shielding performance can be enhanced.

The average thickness of the metal portions is 2 μm or less. From the viewpoint of impregnating the adhesive layer appropriately, the average thickness of the metal portions is preferably 1 μm or less, and more preferably 700 nm or less. From the viewpoint of securing good conductivity, the average thickness of the metal portions is preferably 50 nm or more.

The average thickness of the metal portions can be calculated from, for example, a result of measuring the weight by fluorescent X-ray and drawing a calibration curve of strength-weight, and the density.

The average thickness of the metal-coated nonwoven fabric is 25 μm or less. From the viewpoint of further enhancing the adhesion, the average thickness of the metal-coated nonwoven fabric is preferably 20 μm or less, and more preferably 15 μm or less. From the viewpoint of effectively enhancing the protection performance and the electromagnetic wave shielding performance, the average thickness of the metal-coated nonwoven fabric is preferably 5 μm or more, and more preferably 10 μm or more.

From the viewpoint of effectively enhancing the adhesion, the average thickness of the adhesive layer is preferably 1 μm or more, more preferably 5 μm or more, preferably 25 μm or less, and more preferably 15 μm or less. When the average thickness of the adhesive layer is 5 μm or more, peeling due to repulsion can be effectively suppressed.

The average thickness of the metal-coated nonwoven fabric and the adhesive layer can be obtained by observing a cross section of the metal-coated nonwoven fabric with an adhesive layer in the thickness direction with a microscope or the like and averaging the thickness.

Examples of the material of the nonwoven fabric include polyethylene terephthalate (PET), polyarylate (PAR), and polysulfone (PSU). For example, a covering portion wound around an electric wire or the like may be sometimes exposed to a high temperature. The nonwoven fabric is preferably excellent in heat resistance. Therefore, the glass transition temperature of the material of the nonwoven fabric is preferably 100° C. or more, more preferably 150° C. or more, and further preferably 175° C. or more.

Examples of the material of the metal portion include nickel, copper, silver, platinum, tin, aluminum, and gold. From the viewpoint of effectively enhancing electromagnetic wave shielding performance, it is preferable that the material of the metal portion contains nickel, copper, or silver. Only one kind of these metals may be used, or two or more kinds of these metals may be used in combination.

Examples of the material of the adhesive layer include an acrylic adhesive, a urethane adhesive, a silicone adhesive, and a rubber adhesive.

The adhesive preferably contains a conductive filler, and more preferably contains metal particles. Examples of the material of the conductive filler include metal materials having conductivity such as aluminum, copper, nickel, silver, and gold. The conductive filler may be a conductive filler containing base material particles and conductive portions disposed on the surface of the base material particles. Examples of the base material particles include resin particles, organic/inorganic hybrid particles, metal particles, and inorganic particles excluding metal particles. The shape of the conductive filler is not particularly limited, and may be spherical or not spherical.

The content of the conductive filler in the adhesive is preferably 0.1% by weight or more, more preferably 1% by weight or more, preferably 80% by weight or less, more preferably 60% by weight or less, and further preferably 40% by weight or less. When the content of the conductive filler is the lower limit or more, increase in the resistance value can be suppressed. When the content of the conductive filler is the upper limit or less, the adhesion can be further enhanced and peeling due to repulsion can be further suppressed.

From the viewpoint of impregnating the adhesive layer appropriately, the open area ratio of the metal-coated nonwoven fabric is 1% or more and 50% or less. The open area ratio is the ratio of the area of a mesh portion of the fibers coated with the metal portions per certain area of the metal-coated nonwoven fabric. The open area ratio can be calculated by observation with a microscope or the like. From the viewpoint of impregnating the adhesive layer appropriately, the open area ratio of the metal-coated nonwoven fabric is preferably 2% or more, and more preferably 3% or more. From the viewpoint of effectively enhancing the protection performance and the electromagnetic wave shielding performance, the open area ratio of the metal-coated nonwoven fabric is preferably 40% or less, and more preferably 30% or less.

From the viewpoint of impregnating the adhesive layer appropriately, it is preferable that the basis weight of the metal-coated nonwoven fabric is 1 g/m$^2$ or more and 30 g/m$^2$ or less. The basis weight is the weight per unit area of the metal-coated nonwoven fabric and is a result of measuring the weight per 1 m$^2$. From the viewpoint of impregnating the adhesive layer appropriately, the basis weight per unit area of the metal-coated nonwoven fabric is preferably 3 g/m$^2$ or more, and more preferably 5 g/m$^2$ or more. From the viewpoint of effectively enhancing the protection performance and the electromagnetic wave shielding performance, the basis weight of the metal-coated nonwoven fabric is preferably 30 g/m$^2$ or less, and more preferably 25 g/m$^2$ or less.

Like the metal-coated nonwoven fabric with an adhesive layer 1A, the metal-coated nonwoven fabric with an adhesive layer may include a second adhesive layer on the side opposite to the first surface. The metal-coated nonwoven fabric with an adhesive layer may have adhesive performance on both sides thereof. In this case, the average thicknesses of the first adhesive layer and the second adhesive layer each preferably satisfy the preferable lower limit described above, and each preferably satisfy the preferable upper limit described above.

In the above metal-coated nonwoven fabric with an adhesive layer, the adhesive layer can be impregnated into the metal-coated nonwoven fabric by sticking or pressing the metal-coated nonwoven fabric with an adhesive layer on or against an object to be bonded from the side of the adhesive layer. As a result, strong adhesive performance develops.

The metal-coated nonwoven fabric with an adhesive layer is suitably used for covering the surface of a core wire. The metal-coated nonwoven fabric with an adhesive layer is more suitably used for covering the surface of an electric wire. The above-mentioned metal-coated nonwoven fabric with an adhesive layer is suitably used for covering a curved surface.

(Process for Producing Metal-Coated Nonwoven Fabric with Adhesive Layer)

A process for producing a metal-coated nonwoven fabric with an adhesive layer according to the present invention includes a first step of compressing an uncompressed nonwoven fabric to obtain an nonwoven fabric having an average thickness of ⅘ or less of an average thickness of the uncompressed nonwoven fabric, a second step of coating a surface of a fiber in the nonwoven fabric with a metal portion to obtain a metal-coated nonwoven fabric, and a third step of disposing an adhesive layer on one surface side of the metal-coated nonwoven fabric to obtain a metal-coated nonwoven fabric with an adhesive layer.

The uncompressed nonwoven fabric is a nonwoven fabric before being compressed in the first step. By the first step, the open area ratio and the basis weight of the nonwoven fabric can be appropriately reduced, and the impregnation property of the adhesive layer into the metal-coated nonwoven fabric can be further improved. In addition, it is possible to easily form an adhesive layer having an appropriate thickness on the surface of the metal-coated nonwoven fabric.

From the viewpoint of further improving the impregnation property of the adhesive layer, it is preferable to obtain a nonwoven fabric having an average thickness of ⅗ or less of the average thickness of the uncompressed nonwoven fabric in the first step.

Examples of a method for coating the surface of the fiber in the nonwoven fabric with the metal portion in the second step include a plating method and a sputtering method. In general, in the plating method, it is difficult to make the average thickness of the metal portion small, it is difficult to make the average thickness of the metal portion 2 μm or less, and it is more difficult to make the average thickness of the metal portion 1 μm or less. Also, the plating method tends to provide poor coating uniformity with the metal portion. In the sputtering method, it is easy to make the average thickness of the metal portion small, and it is easy to make the average thickness of the metal portion 1 μm or less. In addition, with the sputtering method, coating uniformity by the metal portion is enhanced.

Therefore, it is preferable that the metal portion is formed by sputtering. By forming the metal portion by sputtering, even if the thickness of the metal portion is small, good electromagnetic wave shielding performance can be obtained.

In the third step, an adhesive layer can be formed by applying an adhesive on the surface of the metal-coated nonwoven fabric.

(Covered Core Wire)

FIG. 3 is a perspective view showing a covered core wire according to the first embodiment of the present invention.

A covered core wire 31 shown in FIG. 3 includes a core wire 41 and a covering portion 42 covering the surface of the core wire 41.

Like the covered core wire 31, the covered core wire according to the present invention includes a core wire and a covering portion covering the surface of the core wire.

The covering portion is the metal-coated nonwoven fabric with an adhesive layer and is formed of the metal-coated nonwoven fabric with an adhesive layer. It is preferable that, in the covering portion, a part of the adhesive layer is impregnated into the metal-coated nonwoven fabric. It is preferable that the covered core wire includes a part of the adhesive layer in the metal-coated nonwoven fabric. By impregnating a part of the adhesive layer into the metal-coated nonwoven fabric, firm adhesion can be developed.

The surface of the core wire may be curved. In the present invention, even if the covering portion is formed on the curved surface, peeling of the covering portion can be prevented.

The covering portion is preferably annular. The annular covering portion may have a cutout portion in a part thereof. In the present invention, peeling of the covering portion can be prevented even if the covering portion is formed in a ring shape.

Hereinafter, the present invention will be described in more detail based on specific examples. The present invention is not limited to the following examples.

Example 1

(1) Compression Treatment of Nonwoven Fabric

A nonwoven fabric (uncompressed nonwoven fabric, fiber diameter 4 μm) having an average thickness of 23.5 μm was prepared. The material of this nonwoven fabric was a polyarylate-based polymer (PAR). The glass transition temperature of this material of the nonwoven fabric was 150° C. or higher.

The nonwoven fabric was compressed by calendering treatment and thus a compressed nonwoven fabric having an average thickness of 10 μm was obtained.

(2) Formation of Metal Portion

By sputtering, the surface of the fiber in the obtained nonwoven fabric was coated with a metal portion (average thickness of inner copper layer: 270 nm, average thickness of outer nickel layer: 30 nm), and thus a metal-coated nonwoven fabric was obtained.

(3) Formation of Adhesive Layer

An adhesive was obtained by mixing 85 parts by weight of butyl acrylate (BA), 11 parts by weight of 2-ethylhexyl acrylate (2EHA), 3 parts by weight of acrylic acid (AAC), 1 part by weight of hydroxyethyl acrylate (HEA), and nickel particles A (average particle diameter: 2.2 μm) of an amount of 30% by weight in the obtained adhesive.

An adhesive was applied on the surface of the metal-coated nonwoven fabric to form an adhesive layer having an average thickness of 10 μm, and thus a metal-coated nonwoven fabric with an adhesive layer was obtained.

Examples 2 to 16 and Comparative Examples 1 to 6

As shown in Table 1 below, a metal-coated nonwoven fabric with an adhesive layer was obtained in the same manner as in Example 1 except that the configuration of the metal-coated nonwoven fabric with an adhesive layer was changed.

In Comparative Examples 1 to 6, the nonwoven fabric was not compressed. In Comparative Example 6, a nonwoven fabric (uncompressed nonwoven fabric, fiber diameter: 4 μm) having an average thickness of 30 μm was used. The material of this nonwoven fabric was a polyarylate-based polymer (PAR). The glass transition temperature of this material of the nonwoven fabric was 150° C. or higher. In Examples 2, 8, 15, and 16 and Comparative Examples 1, 2, and 6, the metal portion was formed by sputtering. In Examples 3 to 7 and 9 to 14 and Comparative Examples 3 to 5, the metal portion was formed by plating. To be noted, when the metal portion was formed by plating, the plating temperature and the plating time were adjusted to progress the plating considerably gently so that the thickness of the metal portion did not become too large. In Examples 1 to 7 and 12 to 13 and Comparative Examples 1 to 6, nickel particles A (average particle diameter: 2.2 μm) were used for the adhesive. In Examples 8 to 11 and 14, nickel particles B (average particle diameter: 5 μm) were used for the adhesive. In Examples 15 and 16, no conductive filler was used for the adhesive.

(Evaluation)

(1) Repulsion

An obtained metal-coated nonwoven fabric with an adhesive layer thus was wound around a bar having a diameter of 1 mm from the side of the adhesive layer and was stuck thereon by being pressed thereagainst. After sticking, it was left to stand at 85° C. for 250 hours, and then the presence or absence of separation was confirmed.

[Criteria for Repulsion]

○: No separation

Δ: Slight separation at the edge (no problem in use)

x: Large separation (2) Resistance

According to JIS K7194, resistance A was evaluated using a four-terminal probe using Loresta (manufactured by Mitsubishi Chemical Analytics).

[Resistance]

○: Resistance A is lower than 1 Ω

Δ: Resistance A is 1Ω or higher and lower than 1.2Ω x: Resistance A is 1.2Ω or higher (3) Resistance Change Rate

In each example, an uncalendered-metal-coated nonwoven fabric with an adhesive layer was obtained in the same manner except that the calendering treatment was not performed. Regarding the uncalendered-metal-coated nonwoven fabric with an adhesive layer corresponding to each example, resistance B was evaluated using a four-terminal probe using Loresta (manufactured by Mitsubishi Chemical Analytics). From the resistance A and the resistance B, the resistance change rate was judged according to the following criteria.

[Resistance Change Rate]

○: Resistance A is lower than 0.7 times of resistance B

Δ: Resistance A is 0.7 times or higher and lower than 1.0 time of resistance B x: Resistance A is 1.0 time or higher of resistance B (4) Shielding Improvement Rate The shielding performance was evaluated using a KEC method (manufactured by TSJ). In each example, an uncalendered-metal-coated nonwoven fabric with an adhesive layer was obtained in the same manner except that the calendering treatment was not performed. An electric field shielding value X of this uncalendered-metal-coated nonwoven fabric with an adhesive layer was set as a reference value. The shielding improvement rate of an electric field shielding value Y of the metal-coated nonwoven fabric with an adhesive layer of each example was evaluated with respect to this electric field shielding value X which is the reference value.

[Shielding Improvement Rate]

○: Electric field shielding value Y is 1.1 times or more of electric field shielding value X Δ: Electric field shielding value Y is 1.02 times or more and less than 1.1 times of electric field shielding value X x: Electric field shielding value Y is less than 1.02 times of electric field shielding value X

TABLE 1

| | Nonwoven fabric Calendering treatment | Metal portion Method for formation | Metal portion Average thickness Cu layer | Metal portion Average thickness Ni layer | Metal portion Average thickness Total | Metal-coated nonwoven fabric Open area ratio | Metal-coated nonwoven fabric Average thickness | Adhesive layer Composition Particle A | Adhesive layer Composition Particle B |
|---|---|---|---|---|---|---|---|---|---|
| Example 1 | Calendered | Sputtering | 270 nm | 30 nm | 300 nm | 7% | 10 μm | 30 wt % | — |
| Example 2 | Calendered | Sputtering | 450 nm | 80 nm | 530 nm | 8% | 10 μm | 30 wt % | — |
| Example 3 | Calendered | Plating | 1385 nm | 593 nm | 1978 nm | 8% | 10 μm | 30 wt % | — |
| Example 4 | Calendered | Plating | 1180 nm | 701 nm | 1881 nm | 10% | 10 μm | 30 wt % | — |
| Example 5 | Calendered | Plating | 1030 nm | 685 nm | 1715 nm | 7% | 10 μm | 30 wt % | — |
| Example 6 | Calendered | Plating | 960 nm | 950 nm | 1910 nm | 7% | 10 μm | 30 wt % | — |
| Example 7 | Calendered | Plating | 1385 nm | 593 nm | 1978 nm | 8% | 10 μm | 15 wt % | — |
| Example 8 | Calendered | Sputtering | 270 nm | 30 nm | 300 nm | 7% | 10 μm | — | 1 wt % |
| Example 9 | Calendered | Plating | 1385 nm | 593 nm | 1978 nm | 8% | 10 μm | — | 5 wt % |
| Example 10 | Calendered | Plating | 1385 nm | 593 nm | 1978 nm | 8% | 10 μm | — | 9 wt % |
| Example 11 | Calendered | Plating | 960 nm | 950 nm | 1910 nm | 7% | 10 μm | — | 1 wt % |
| Example 12 | Calendered | Plating | 1385 nm | 593 nm | 1978 nm | 8% | 10 μm | 30 wt % | — |
| Example 13 | Calendered | Plating | 1385 nm | 593 nm | 1978 nm | 8% | 10 μm | 50 wt % | — |
| Example 14 | Calendered | Plating | 1385 nm | 593 nm | 1978 nm | 8% | 10 μm | — | 0.5 wt % |
| Example 15 | Calendered | Sputtering | 270 nm | 30 nm | 300 nm | 7% | 10 μm | — | — |
| Example 16 | Calendered | Sputtering | 270 nm | 30 nm | 300 nm | 7% | 18 μm | — | — |
| Comparative Example 1 | Not calendered | Sputtering | 200 nm | 22 nm | 222 nm | 80% | 23.5 μm | 30 wt % | — |
| Comparative Example 2 | Not calendered | Sputtering | 390 nm | 100 nm | 490 nm | 70% | 23.5 μm | 30 wt % | — |
| Comparative Example 3 | Not calendered | Plating | 1110 nm | 475 nm | 1585 nm | 70% | 23.5 μm | 30 wt % | — |
| Comparative Example 4 | Not calendered | Plating | 850 nm | 560 nm | 1410 nm | 70% | 23.5 μm | 30 wt % | — |
| Comparative Example 5 | Not calendered | Plating | 720 nm | 700 nm | 1420 nm | 80% | 23.5 μm | 30 wt % | — |
| Comparative Example 6 | Not calendered | Sputtering | 200 nm | 22 nm | 222 nm | 80% | 30 μm | 30 wt % | — |

| | Adhesive layer Composition BA (parts by weight) | 2EHA (parts by weight) | AAC (parts by weight) | HEA (parts by weight) | Average thickness | Evaluation Repulsion | Resistance Ra | Resistance change rate | 1-1000 MHz shielding improvement rate |
|---|---|---|---|---|---|---|---|---|---|
| Example 1 | 85 | 11 | 3 | 1 | 10 μm | ○ | ○ | ○ | ○ |
| Example 2 | 85 | 11 | 3 | 1 | 10 μm | ○ | ○ | ○ | ○ |
| Example 3 | 85 | 11 | 3 | 1 | 10 μm | ○ | ○ | ○ | ○ |
| Example 4 | 85 | 11 | 3 | 1 | 10 μm | ○ | ○ | ○ | ○ |
| Example 5 | 85 | 11 | 3 | 1 | 10 μm | ○ | ○ | ○ | ○ |
| Example 6 | 85 | 11 | 3 | 1 | 10 μm | ○ | ○ | ○ | ○ |
| Example 7 | 85 | 11 | 3 | 1 | 10 μm | ○ | ○ | ○ | ○ |
| Example 8 | 85 | 11 | 3 | 1 | 10 μm | ○ | ○ | ○ | ○ |
| Example 9 | 85 | 11 | 3 | 1 | 10 μm | ○ | ○ | ○ | ○ |
| Example 10 | 85 | 11 | 3 | 1 | 10 μm | ○ | ○ | ○ | ○ |
| Example 11 | 85 | 11 | 3 | 1 | 10 μm | ○ | ○ | ○ | ○ |
| Example 12 | 85 | 11 | 3 | 1 | 4 μm | Δ | ○ | ○ | ○ |
| Example 13 | 85 | 11 | 3 | 1 | 10 μm | Δ | ○ | ○ | ○ |
| Example 14 | 85 | 11 | 3 | 1 | 10 μm | ○ | Δ | ○ | ○ |
| Example 15 | 85 | 11 | 3 | 1 | 2 μm | ○ | Δ | ○ | ○ |
| Example 16 | 85 | 11 | 3 | 1 | 10 μm | ○ | ○ | ○ | ○ |
| Comparative Example 1 | 85 | 11 | 3 | 1 | 10 μm | X | ○ | — | — |
| Comparative Example 2 | 85 | 11 | 3 | 1 | 10 μm | X | ○ | — | — |
| Comparative Example 3 | 85 | 11 | 3 | 1 | 10 μm | X | ○ | — | — |
| Comparative Example 4 | 85 | 11 | 3 | 1 | 10 μm | X | ○ | — | — |
| Comparative Example 5 | 85 | 11 | 3 | 1 | 10 μm | X | ○ | — | — |
| Comparative Example 6 | 85 | 11 | 3 | 1 | 10 μm | X | Δ | — | — |

To be noted, in Examples 1, 2, 8, 15, and 16 in which the metal portion was formed by sputtering, variation of the resistance A was small in a plurality of metal-coated nonwoven fabrics with adhesive layers as compared with Examples 3 to 7 and 9 to 14 in which the metal portion was formed by plating.

EXPLANATION OF SYMBOLS 1, 1A: metal-coated nonwoven fabric with an adhesive layer
11: metal-coated nonwoven fabric
12, 13: adhesive layer
31: covered core wire
41: core wire
42: covering portion

The invention claimed is:

1. A metal-coated nonwoven fabric with an adhesive layer comprising:
   a metal-coated nonwoven fabric; and
   an adhesive layer disposed on one surface side of the metal-coated nonwoven fabric,
   the metal-coated nonwoven fabric including a nonwoven fabric and a metal portion coating the surface of a fiber in the nonwoven fabric,
   an average thickness of the metal portion being 2 μm or less,
   an average thickness of the metal-coated nonwoven fabric being 25 μm or less,
   an open area ratio of the metal-coated nonwoven fabric being 1% or more and 50% or less.

2. The metal-coated nonwoven fabric with an adhesive layer according to claim 1, the average thickness of the metal portion being 1 μm or less.

3. The metal-coated nonwoven fabric with an adhesive layer according to claim 1, a material of the metal portion including nickel, copper or silver.

4. The metal-coated nonwoven fabric with an adhesive layer according to claim 1, the average thickness of the metal-coated nonwoven fabric being 20 μm or less.

5. The metal-coated nonwoven fabric with an adhesive layer according to claim 1, the open area ratio of the metal-coated nonwoven fabric being 30% or less.

6. The metal-coated nonwoven fabric with an adhesive layer according to claim 1, the open area ratio of the metal-coated nonwoven fabric being 3% or more.

7. The metal-coated nonwoven fabric with an adhesive layer according to claim 1, a glass transition temperature of a material of the nonwoven fabric being 150° C. or higher.

8. The metal-coated nonwoven fabric with an adhesive layer according to claim 1, the adhesive layer containing a conductive filler.

9. The metal-coated nonwoven fabric with an adhesive layer according to claim 8, the content of the conductive filler in the adhesive layer being 0.1% by weight or more and 80% by weight or less.

10. A process for producing a metal-coated nonwoven fabric with an adhesive layer according to claim 1, the process comprising:
    a step of compressing an uncompressed nonwoven fabric to obtain an nonwoven fabric having an average thickness of $4/5$ or less of an average thickness of the uncompressed nonwoven fabric;
    a step of coating a surface of a fiber in the nonwoven fabric with a metal portion to obtain a metal-coated nonwoven fabric; and
    a step of disposing an adhesive layer on one surface side of the metal-coated nonwoven fabric to obtain a metal-coated nonwoven fabric with an adhesive layer.

11. The process for producing a metal-coated nonwoven fabric with an adhesive layer according to claim 10, the uncompressed nonwoven fabric being compressed by calendering treatment.

12. The process for producing a metal-coated nonwoven fabric with an adhesive layer according to claim 10, the surface of the fiber in the nonwoven fabric being coated with the metal portion by sputtering.

13. A covered core wire comprising:
    a core wire; and
    a covering portion covering a surface of the core wire,
    the covering portion being the metal-coated nonwoven fabric with an adhesive layer according to claim 1.

* * * * *